United States Patent [19]
Bohland et al.

[11] Patent Number: 6,063,995
[45] Date of Patent: May 16, 2000

[54] RECYCLING SILICON PHOTOVOLTAIC MODULES

[75] Inventors: John Raphael Bohland, Oregon; Igor Ivanovich Anisimov, Whitehouse, both of Ohio

[73] Assignee: First Solar, LLC, Toledo, Ohio

[21] Appl. No.: 09/116,287

[22] Filed: Jul. 16, 1998

[51] Int. Cl.$^7$ .................................................. H01L 25/00
[52] U.S. Cl. .......................................... 136/243; 136/290
[58] Field of Search ..................................... 136/243, 290

[56] References Cited

PUBLICATIONS

Energy Analysis of PV Classing Systems—Kathleen M. Hynes & Nicola M. Pearsall, NAPC, University of Northumbria, Newcastle upon Tyne, NE1 8ST, UK—Presented at the 25th IEEE Photovoltaic Specialists Conference, Washington, May 1996.
Recycling of PV Modules—K. Wambach, Paper Presented at 2nd World Conference and Exhibition on Photovoltaic Solar Energy Conversion, Vienna, Jul. 6–11, 1998.
Module Recycling for Saving Resources and Manufacturing Cost—Koichi Sakuta, Akinobu Murata and Kazuhiko Kato—Technical Digest of the International PVSEC-9, Nov. 1996, Int'l PVSEC-9-205 to 9-206.
Re–Cycling of High Value, High Energy Content Components of Silicon PV Modules—T M Burton, R D W Scott, J P Nagle, 12th EC PVSEC Amsterdam 1994; pp. 303-304.
Possibility of Recycling Silicon PV Modules—John R. Bohland & Igor I. Anisimov—26th PVSC; Sep. 30–Oct. 3, 1997, Anaheim, CA; pp. 1173–1175.

*Primary Examiner*—Mark Chapman
*Attorney, Agent, or Firm*—Brooks & Kushman P.C.

[57] ABSTRACT

The present invention relates to a method for recycling crystalline silicon photovoltaic modules comprising (a) providing a crystalline silicon photovoltaic module having (i) a glass substrate, (ii) at least one layer of polymeric material, and (iii) at least one solar cell, (b) providing an inert atmosphere, and (c) heating the module in the inert atmosphere.

41 Claims, 3 Drawing Sheets

RECYCLING SILICON PHOTOVOLTAIC MODULES

TECHNICAL FIELD

This invention relates to a method and system for recycling silicon photovoltaic modules.

BACKGROUND ART

Crystalline silicon photovoltaic modules typically comprise a plurality of solar cells laminated between a first layer and a second layer of ethylene-vinyl acetate (EVA) polymeric material, a glass substrate adhered to the first layer of polymeric material, and a Tedlar®-polyester-Tedlar® polymeric backing sheet adhered to the second layer of polymeric material. Lead soldered electrical ribbon is used to interconnect the solar cells of the module. A power collection system is used to convey power generated from the module to other components.

A typical solar cell comprises an expensive high purity silicon wafer having a first side doped with boron, a second side doped with phosphorus, and silver contact grids on both sides. The solar cells accounts for about fifty percent of the total cost of the raw materials of a crystalline silicon photovoltaic module. A crystalline silicon photovoltaic module could theoretically be used for many years without suffering any loss in efficiency since they do not experience any photodegradatation. However, a lamination defect, broken or chipped glass substrate, or failure of the power collection system usually results after a period of time rendering the entire module inoperative even though the relatively expensive solar cells are still operable. Moreover, lead is a potentially hazardous material, and as such, requires disposal considerations. Until now, there has been no acceptable method for recycling silicon photovoltaic modules to recover the solar cells, the lead and other module components from the modules.

Some unsuccessful attempts have been made to recover silicon wafers from silicon photovoltaic modules in the past. One such attempt employed a nitric acid etching system to free the silicon wafer from the EVA polymeric layers. While this method resulted in the recovery of intact silicon wafers, the silver cell contacts were completely etched from the silicon wafer, rendering the silicon wafer inoperable for use in a crystalline silicon photovoltaic module without reapplying silver cell contacts to the silicon wafer. Additionally, this nitric acid etching system also produced undesirable $NO_x$ gases and a contaminated waste acid stream. Another such attempt to recover silicon wafers from silicon photovoltaic modules involved thermal decomposition, which proved to be unsuccessful because of carbonization of the EVA polymer at 200° C. in air.

Accordingly, it would be desirable to be able to recycle silicon photovoltaic modules to recover solar cells, lead and other module components without creating any undesirable gases. Moreover, it would be further desirable to be able to recover whole solar cells (i.e., silicon wafers still having their silver contact grids intact so that the solar cells could be reused to make other crystalline silicon photovoltaic modules without requiring reprocessing of the silicon wafers to apply the silver contact grids.

DISCLOSURE OF THE INVENTION

One object of the present invention is to safely recycle crystalline silicon photovoltaic modules to recover lead and solar cells.

Another object of the present invention is to recover whole solar cells so that the solar cells may be reused to make other crystalline silicon photovoltaic modules without requiring any reapplication of silver contact grids.

In carrying out the above, and other, objects of the present invention, the method of the present invention for recycling crystalline silicon photovoltaic modules comprising providing a crystalline silicon photovoltaic module comprising a glass substrate, at least one layer of polymeric material, and at least one solar cell, providing an inert atmosphere, and heating the module in the inert atmosphere.

The above, and other objects, features and advantages of the present invention are readily apparent from the following detailed description of the best mode for carrying out the invention when taken in connection with the accompanying drawings.

BEST MODES FOR CARRYING OUT THE INVENTION

Figure 1:
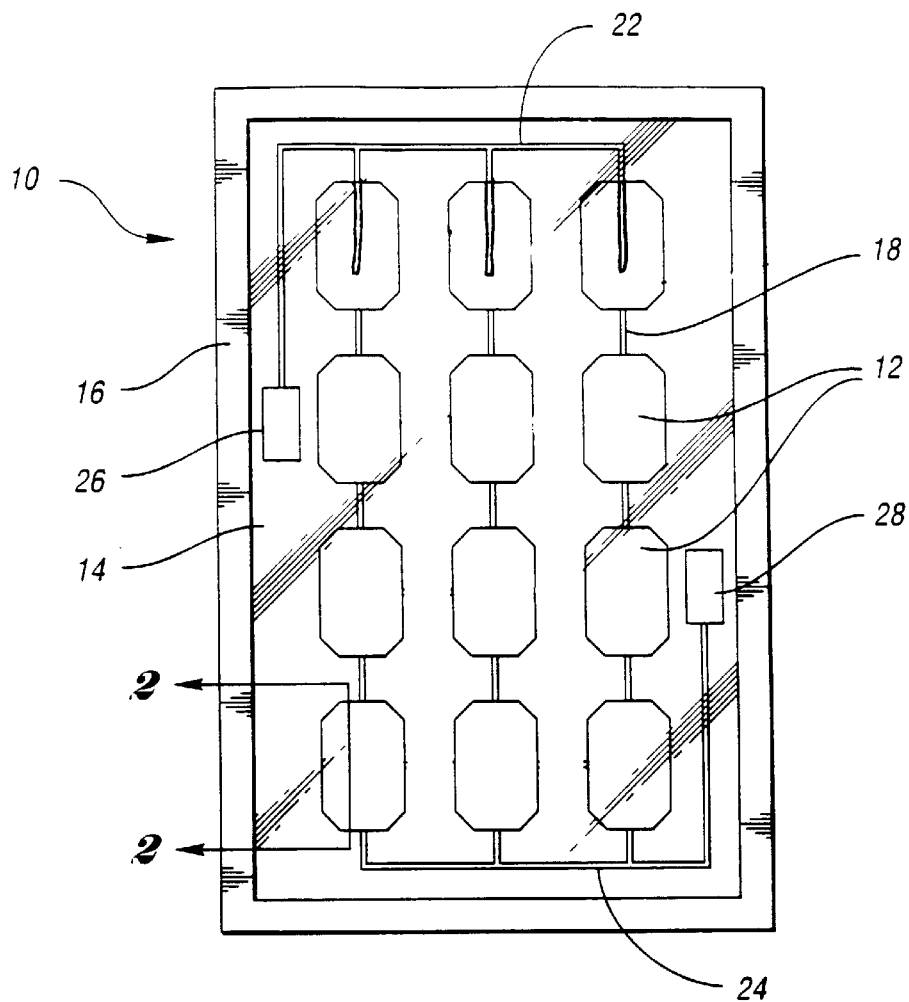
FIG. 1 is a schematic elevational view illustrating an exemplary crystalline silicon photovoltaic module for use with the present invention.

The present invention relates to a method for recycling crystalline silicon photovoltaic modules 10 to recover operable solar cells and hazardous lead from the modules 10 while preventing the dissemination of hazardous silver. The module 10 may be of a variety of constructions. An exemplary module 10 is shown in FIGS. 1 and 2.

The module 10 comprises a plurality of solar cells 12 which are enclosed in an encasement 14. The encasement 14 is housed in a frame 16 which is preferably made of extruded anodized alluminum or aluminum alloy. The solar cells 12 are spaced apart in a plurality of rows. The solar cells 12 are electrically connected in series and in parallel by electrical ribbon 18 which is lead soldered to the solar cells 12. The electrical ribbon 18 preferably is a copper ribbon and is preferably coated with lead but could also be coated with tin.

A first busbar 22 is embedded in the encasement 14 and extends along essentially the entire length of a first end of the module 10 and down about one-half of a first side of the module 10 as best shown in FIG. 1. A second busbar 24 is embedded in the encasement 14 and extends along essentially the entire length of a second end, opposite the first end, of the module 10 and up about one-half of a second side, opposite the first side, of the module. The busbars 22 and 24 are preferably made of copper and provide an electrical connection between the solar cells 12 and a first and second junction box 26 and 28, respectively. The junction boxes 26 and 28 provide a means for conveying the electricity produced by the module 10 to other components, such as charge regulators, batteries and inverters.

Figure 2:
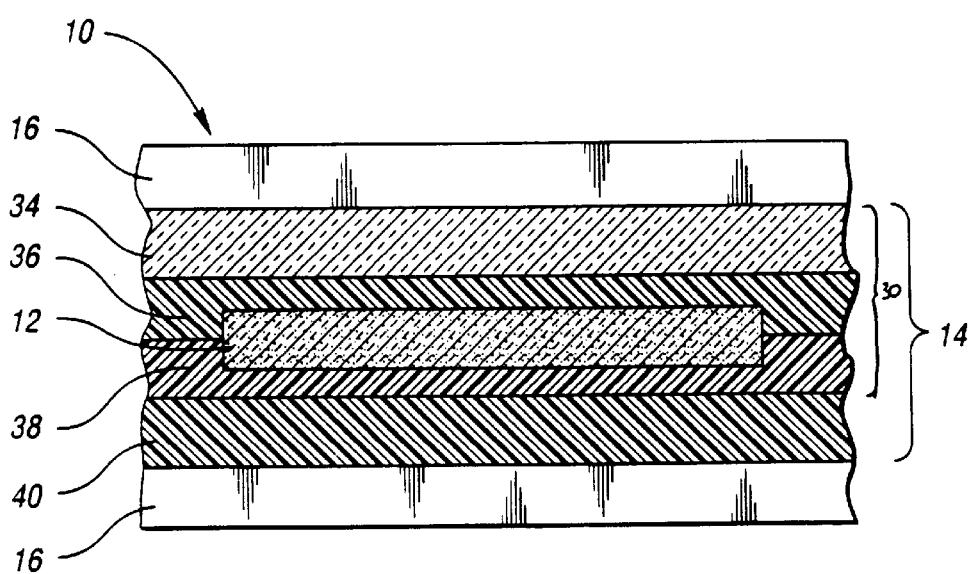
FIG. 2 is a sectional view taken along line 2—2 of FIG. 1.
Figure 4:
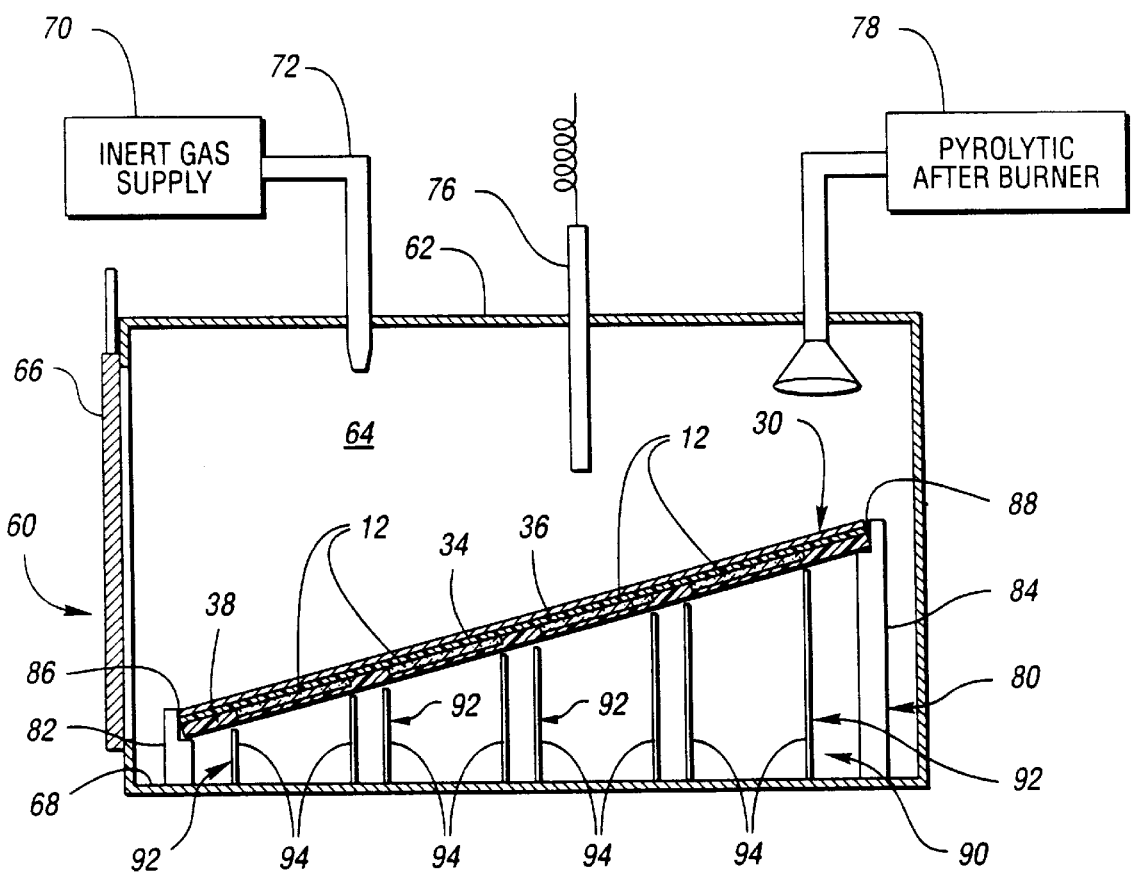
FIG. 4 is a schematic elevational view illustrating an apparatus for heating crystalline silicon photovoltaic modules in an inert atmosphere and parts of a crystalline silicon module in the apparatus prior to heating.

With reference to FIG. 2, the module 10, and more specifically, the encasement 14 of the module will be described in more detail. The encasement 14 comprises a module subassembly 30 and a polymeric backing layer 40. The module subassembly 30 comprising a glass substrate 34, a first polymeric layer 36, a second polymeric layer 38, the solar cells 12, the electrical ribbon 18 and the busbars 22 and 24. The first and second polymer layers 36 and 38 are preferably made of ethylene-vinyl-acetate (EVA). The solar cells 12 are sandwiched between the first and second polymeric layers 36 and 38, as best shown in FIG. 4. The glass substrate 34 is adhered to, and covers the first polymeric layer 36. The polymeric backing layer 40 is adhered to, and covers, the second polymeric layer 38 of the module subassembly 30. The junction boxes 26 and 28 are connected to the exterior surface of the polymeric backing layer 40.

Figure 3:
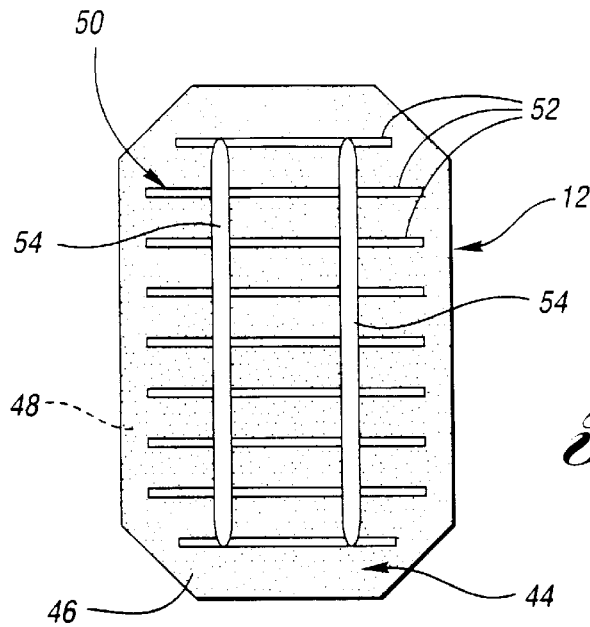
FIG. 3 is an elevational view of an exemplary solar cell.

With reference to FIG. 3, the solar cell 12 will be described in more detail. The solar cell 12 comprises a silicon wafer 44 having a first side 46 doped with boron and a second side 48 doped with phosphorous. Each side 46 and 48 of the silicon wafer 44 has an electrical contact grid 50 (shown only on the first side 46) adhered thereto. The electrical contact grid 50 includes a plurality of laterally extending parallel lines 52 and a pair of longitudinally extending parallel lines 54 extending between the first and last line 52. The electrical grid 50 preferably comprises silver paste which is applied to the first and second sides 46 and 48 of the silicon wafer 44 using well-known screen-printing technology.

With reference to FIG. 4, the present invention provides an apparatus 60 for reclaiming the solar cells 12, the glass substrate 34, the copper, the lead, and other module components from the module 10. The apparatus 60 includes a housing 62 defining a heating chamber 64 in which the module subassembly 30 is heated. The housing 62 includes a door member 66 for allowing ingress into, and egress from, the chamber 64. The housing 62 further includes a floor 68 which helps to define the chamber 64. The housing 62 is heatable in any suitable manner such that the heating chamber 64 is maintainable at a temperature of about 480° C. to about 540° C.

The housing 62 further includes a supply 70 of inert gas having a conduit 72 in fluid communication with the chamber 64 for generating an inert atmosphere in the chamber. The supply 70 of inert gas can be any inert gas, or mixtures of inert gases, and is preferably nitrogen. The housing 62 further includes a thermocouple 76 for measuring the temperature within the chamber 64 and a pyrolytic afterburner 78 for combusting gases created within the chamber 64 during the method of the present invention into carbon dioxide ($CO_2$) and water ($H_2O$) vapor.

Figure 6:
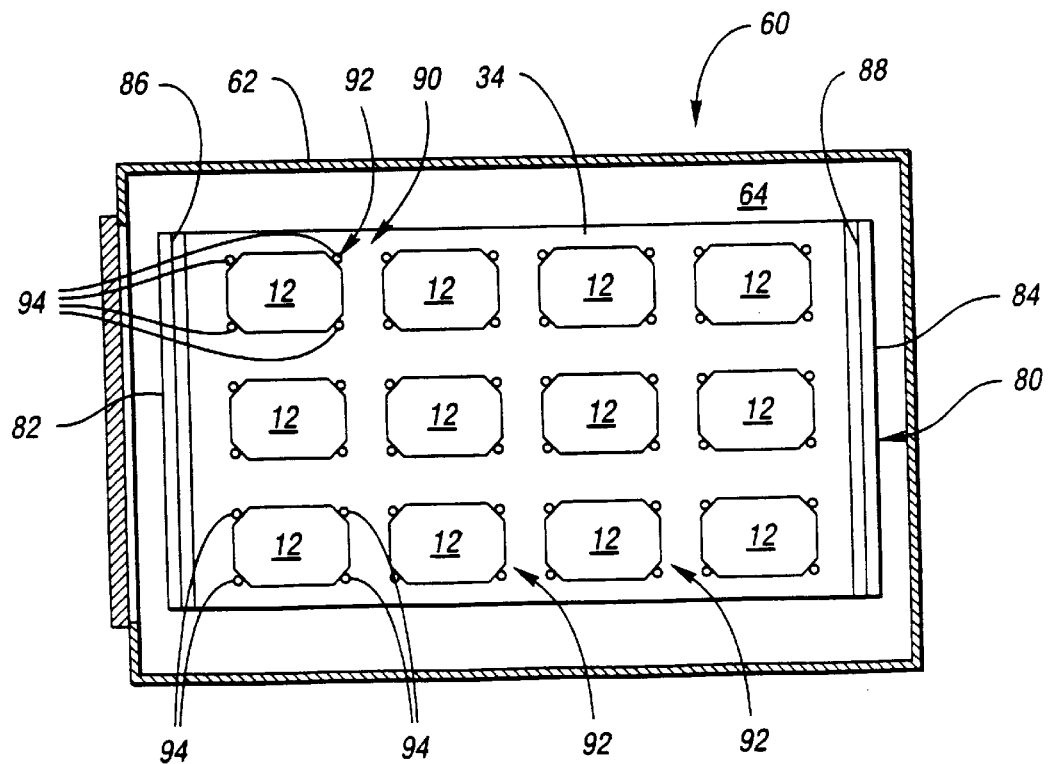
FIG. 6 is a sectional view taken along line 6—6 of FIG. 5.

The apparatus 60 further includes a module subassembly holder 80 which initially supports the module subassembly 30, and subsequently supports, as will be explained below, the glass substrate 34. The module subassembly holder 80 is supported on the floor 68 of the housing and comprises a first leg member 82 and a second leg member 84, spaced apart, and parallel to, the first leg member. Both leg members 82 and 84 of the module subassembly holder 80 have a lateral extent, as best shown in FIG. 6, which is sufficient for securely supporting the module subassembly 30, and is preferably about the lateral extent, or width, of the module subassembly. Each leg member 82 and 84 has surfaces which define opposed ridges 86 and 88, respectively. The first leg member 82 is preferably shorter than the second leg member 84 so that the module subassembly 30 is positioned at an angle, as shown in FIG. 4, when supported by the holder 80 to allow any liquid (intermediate) decomposition products produced during the method of the present invention to gravity drain from the parts of the module subassembly.

Figure 5:
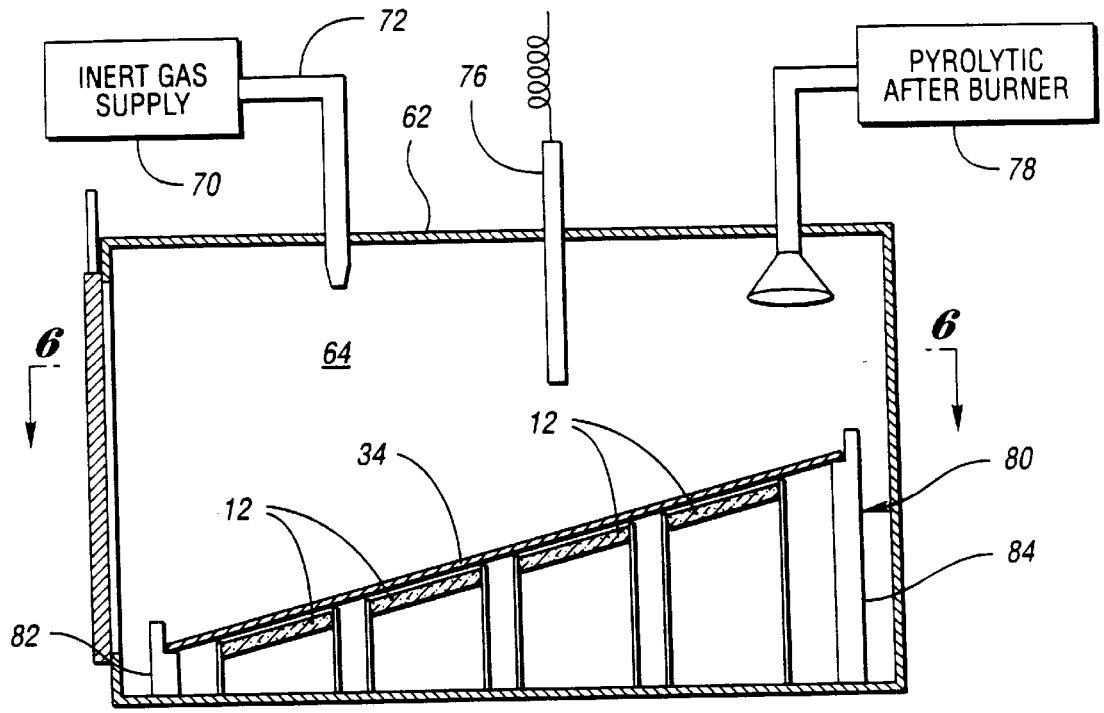
FIG. 5 is a schematic elevational view illustrations an apparatus for heating crystalline silicon photovoltaic modules in an inert atmosphere and parts of a crystalline silicon module in the apparatus after heating.

The apparatus 60 further includes a solar cell holder 90 supported on the floor 86 of the housing 62. The holder 90 comprises a plurality of groups 92 of pins for supporting the solar cells 12 after they separate, or release, from the module subassembly 30, as will be described further below. Each group 92 of pins preferably comprises four spaced apart pins 94, as best shown in FIG. 6, which are positioned below each solar cell 12 for supporting a respective solar cell. More specifically, each pin 94 in each group 92 of pins, is spaced below a respective corner of a respective solar cell 12. In each group 92 of pins, the two pins 94 closer to leg member 84 are preferably higher than the two pins 94 closer to leg member 82, as best shown in FIGS. 4 and 5, to provide for a smooth transition from the module subassembly 30 to the solar cell holder 90, and to allow any liquid (intermediate) decomposition products produced during the method of the present invention to gravity drain from the solar cells 12. The solar cell holder 90 may be integral with the module subassembly holder 80. Both holders 80 and 90 are preferably made of highly thermally conductive material such as aluminum or quartz.

To recover module components from the modules 10, the frame 16, the junction boxes 26 and 28, and the polymeric backing layer 40 are first removed from the module, resulting in the module subassembly 30. The frame 16 is preferably unscrewed from the module 10 and saved for reuse. The junction boxes 26 and 28 are preferably manually pried off of the polymeric backing layer 40 with a wrench or other suitable tool. The module 10, now minus the frame 16 and the junction boxes 26 and 28, is then heated gently to enable manual peeling off of the plastic backing layer 40. The encasement 14 is preferably heated to about 100° C. to facilitate the manual peeling off of the plastic backing layer 40.

The module subassembly 30 is then supported in the chamber 64 of the housing 62 by the holder 80, as best shown in FIG. 4. The chamber 64 is heated to between about 480° C. to about 540° C. so that the module subassembly 30 is heated to between about 480° C. to about 540° C. The chamber 62 is maintained at a temperature between about 480° C. and 540° C. for a period of time sufficient to thermally decompose all of the polymeric layers 36 and 38, and preferably, between about 15 minutes to about 4 hours, and most preferably for about an hour. During the heating, inert gas is introduced from the supply 70 of inert gas to the chamber 64 at a rate sufficient to produce an inert atmosphere in the chamber which is sufficient to prevent combustion/carbonization of the polymeric layers 36 and 38 at temperatures between about 480° C. and 540° C.

The first and second polymeric layers 36 and 38 thermally decompose in the inert atmosphere in the chamber 64 when the temperature in the chamber is between about 480° C. to about 540° C. As the first and second polymeric layers 36 and 38 thermally decompose, the solar cells 12 release from the thermally decomposing plastic layers 36 and 38 and fall gently to the solar cell holder 90 so that the solar cells are supported on the solar cell holder at an angle, as best shown in FIG. 5. During the thermal decomposition, the lead solder, the electrical ribbon 18, and the busbars 22 and 24 fall to the floor 68 of the housing 62. As the first and second polymeric layers 36 and 38 thermally decompose, the glass substrate 34 remains supported on the holder 80, as best shown in FIG. 5. The gaseous decomposition products of the thermally decomposed first and second polymeric layers 36 and 38 are combusted in the pyrolytic afterburner 78 to carbon dioxide ($CO_2$) and water ($H_2O$) vapor. The heat of combustion may be recovered for other application or processes.

After thermal decomposition of the first and second polymeric layers 36 and 38 is complete, the chamber 64 is then allowed to cool to room temperature, at which time the glass substrate 34 and the solar cells 12 can be removed from the housing 62 for reuse. The recovered cells 12 retain between about 80 percent to about 100 percent of their unlaminated cell efficiency. The floor 65 of the housing 62 can be swept to remove the lead, copper and tin if the electrical ribbon 18 is coated with tin, from the electrical ribbon 18, busbars 22 and 24, and lead solder from the housing 62.

While it is a desirable feature of the present invention to be able to recover reusable solar cells 12 from modules 10, it should be noted that silver from the electrical contact grids 50 could be removed from the recovered solar cells 12 by acid etching and then recovered using cementation if it were so desired.

EXAMPLE

A crystalline silicon photovoltaic module subassembly is provided having a solar cell laminated in a first and a second layer of EVA and a glass substrate adhered to one of the layers of EVA. The solar cell comprises a silicon wafer having a first side doped with boron and a second side doped with phosphorous. Each side of the wafer has an electrical contact grid. The module subassembly was supported in chamber having a nitrogen atmosphere. The chamber was heated in the nitrogen atmosphere at about 520° C. for about 1 hour. The layers of EVA thermally decomposed from the module subassembly, leaving the solar cell and the glass substrate intact. The solar cell was measured to have retained about 83 percent of its unlaminated cell efficiency.

While the best mode for carrying out the invention has been described in detail, those familiar with the art to which the invention relates will appreciate other ways of carrying out the invention defined by the following claims. For instance, the solar cell holder 90 and the holder 80 could be conveyed through a housing 62 in a continuous process instead of the batch process described above.

What is claimed is:

1. A method for recycling crystalline silicon photovoltaic modules, said method comprising:
   providing a crystalline silicon photovoltaic module comprising a glass substrate, at least one layer of polymeric material, and at least one solar cell;
   providing an inert atmosphere; and
   heating the module in the inert atmosphere.

2. The method for recycling crystalline silicon photovoltaic modules of claim 1 wherein said step of heating the module comprises heating the module to a temperature sufficient to thermally decompose the polymeric material.

3. The method for recycling crystalline silicon photovoltaic modules of claim 2 wherein said step of heating the module to a temperature sufficient to thermally decompose the polymeric material comprises heating the module to a temperature of between about 480° C. to about 540° C.

4. The method for recycling crystalline silicon photovoltaic modules of claim 3 wherein said step of providing an inert atmosphere comprises providing a housing having a chamber for containing the inert atmosphere.

5. The method for recycling crystalline silicon photovoltaic modules of claim 4 further comprising cooling the chamber after said heating step.

6. The method for recycling crystalline silicon photovoltaic modules of claim 4 wherein the module further comprises lead and the housing comprises a floor, with lead falling to the floor as a result of said heating step.

7. The method for recycling crystalline silicon photovoltaic modules of claim 6 wherein the module comprises a plurality of solar cells interconnected by metallic ribbon, the metallic ribbon falling to the floor as a result of said heating step.

8. The method for recycling crystalline silicon photovoltaic modules of claim 7 wherein the metallic ribbon is made of copper.

9. The method for recycling crystalline silicon photovoltaic modules of claim 8 wherein the ribbon is coated with a material selected from the group consisting of lead and tin.

10. The method for recycling crystalline silicon photovoltaic modules of claim 1 wherein the solar cell comprises a crystalline silicon wafer having a first side having a first electrical contact grid and a second side having a second electrical contact grid and the polymeric material comprises ethylene-vinyl-acetate.

11. The method for recycling silicon photovoltaic modules of claim 1 wherein the module comprises two polymeric layers encapsulating at least one solar cell and the glass substrate is adhered to one of the polymeric layers, said method further comprising providing a first holder for supporting the module during said heating step.

12. The method for recycling silicon photovoltaic modules of claim 11 wherein the polymeric layers thermally decompose during said heating step and the solar cells fall in a direction away from the glass substrate as a result of said heating step, the glass substrate being supported by the first holder and being substantially free of polymeric material as a result of said heating step.

13. The method for recycling silicon photovoltaic modules of claim 12 further comprising providing a second holder, the second holder supporting the at least one solar cell after the solar cell falls as a result of said heating step.

14. The method for recycling silicon photovoltaic modules of claim 13 wherein the solar cells are substantially free of polymeric material, metallic ribbon and lead solder after said heating step.

15. The method for recycling silicon photovoltaic modules of claim 14 wherein the first holder comprises a first leg and a second leg, the second leg supporting a first end of the module at a first position and the first leg supporting a second end of the module at a second position, lower than the fir st position, such that the first holder supports the module at an angle.

16. The method for recycling silicon photovoltaic modules of claim 15 wherein the first holder is made of aluminum.

17. The method for recycling crystalline silicon photovoltaic modules of claim 1 wherein said heating step comprises heating the module for at least about fifteen minutes.

18. The method for recycling crystalline silicon photovoltaic modules of claim 1 wherein said heating step comprises heating the module for at least about one hour.

19. A method for recycling crystalline silicon photovoltaic modules, said method comprising:
   providing a module comprising a glass substrate, a first layer of polymeric material adhered to the glass substrate, a plurality of solar cells comprising a silicon wafer and electrical contact grids, a second layer of polymeric material adhered to the first layer of polymeric material, the solar cells being encapsulated by the first and second layers of polymeric materials, a backing layer adhered to the second layer of polymeric material;

providing a chamber;

removing the backing layer from the module to form a module subassembly;

providing an inert atmosphere in the chamber; and heating the module subassembly in an inert atmosphere in the chamber.

20. The method for recycling crystalline silicon photovoltaic modules of claim 19 wherein said step of heating the module subassembly comprises heating the module subassembly to a temperature sufficient to thermally decompose the polymeric material.

21. The method for recycling crystalline silicon photovoltaic modules of claim 20 wherein said step of heating the module subassembly to a temperature sufficient to thermally decompose the polymeric material comprises heating the module subassembly to a temperature of between about 480° C. to about 540° C.

22. The method for recycling crystalline silicon photovoltaic modules of claim 21 further comprising cooling the chamber after said heating step.

23. The method for recycling crystalline silicon photovoltaic modules of claim 19 wherein the module further comprises a metallic frame, the metallic frame being separated from the module before said step of removing the backing layer.

24. The method for recycling crystalline silicon photovoltaic modules of claim 19 wherein the module subassembly further comprises lead and the housing comprises a floor, with lead falling to the floor as a result of said heating step.

25. The method for recycling crystalline silicon photovoltaic modules of claim 24 wherein the module further comprises metallic ribbon interconnecting the plurality of solar cells, the metallic ribbon falling to the floor as a result of said heating step.

26. The method for recycling crystalline silicon photovoltaic modules of claim 25 wherein the metallic ribbon is made of copper.

27. The method for recycling crystalline silicon photovoltaic modules of claim 26 wherein the ribbon is coated with a material selected from the group consisting of lead and tin.

28. The method for recycling crystalline silicon photovoltaic modules of claim 27 wherein the polymeric material comprises ethylene-vinyl-acetate.

29. The method for recycling silicon photovoltaic modules of claim 28 further comprising providing a first holder for supporting the module subassembly during said heating step.

30. The method for recycling silicon photovoltaic modules of claim 29 wherein the solar cells fall in a direction away from the glass substrate as a result of said heating step, the glass substrate being supported by the first holder and being substantially free of polymeric material as a result of said heating step.

31. The method for recycling silicon photovoltaic modules of claim 30 further comprising providing a second holder, the second holder supporting the solar cell after the solar cells fall as a result of said heating step.

32. The method for recycling silicon photovoltaic modules of claim 21 wherein the solar cells are substantially free of polymeric material, metallic ribbon and lead solder after said heating step.

33. The method for recycling silicon photovoltaic modules of claim 32 wherein the first holder comprises a first leg and a second leg, the second leg supporting a first end of the module subassembly at a first position and the first leg supporting a second end of the module subassembly of a second position, lower than the first position, such that the first holder supports the module subassembly at an angle.

34. The method for recycling silicon photovoltaic modules of claim 33 wherein the first holder is made of aluminum.

35. The method for recycling crystalline silicon photovoltaic modules of claim 34 wherein said step of removing the backing layer comprises heating the module and gently peeling away the backing layer from the second layer of polymeric material.

36. The method for recycling crystalline silicon photovoltaic modules of claim 19 wherein said heating step comprises heating the module subassembly for at least about fifteen minutes.

37. The method for recycling crystalline silicon photovoltaic modules of claim 19 wherein said heating step comprises heating the module subassembly for at least about one hour.

38. A method for recycling crystalline silicon photovoltaic modules, said method comprising:

providing a module comprising a glass substrate, a first layer of polymeric material adhered to the glass substrate, a plurality of solar cells comprising a silicon wafer and electrical contact grids, a second layer of polymeric material adhered to the first layer of polymeric material, the solar cells being electrically connected by metallic ribbon and being encapsulated by the first and second layers of polymeric materials, a backing layer adhered to the second layer of polymeric material;

providing an apparatus comprising a housing defining a chamber, the housing including a supply of inert gas in fluid communication with the chamber;

removing the backing layer from the module to form a module subassembly;

actuating the supply of inert gas to provide an inert atmosphere in the chamber;

supporting the module subassembly in the chamber; and heating the module subassembly in the inert atmosphere in the chamber to a temperature sufficient to thermally decompose the polymeric material.

39. The method for recycling crystalline silicon photovoltaic modules of claim 38 wherein said step of heating the module subassembly to a temperature to a temperature sufficient to thermally decompose the polymeric material comprises heating the module subassembly to a temperature of between about 480° C. to about 540° C.

40. A method for recycling crystalline silicon photovoltaic modules, said method comprising:

providing a crystalline silicon photovoltaic module comprising a glass substrate, at least one solar cell, and at least one layer of polymeric material disposed between the glass substrate and the at least one solar cell, the at least one layer of polymeric material securing the at least one solar cell to the glass substrate, the at least one solar cell comprising a silicon wafer having a first electrical contact grill and a second side having a second electrical contact grid;

providing an inert atmosphere;

heating the module in the inert atmosphere, the polymeric material thermally decomposing during the heating step; and recovering the solar cell in the glass substrate, the glass substrate being detached from the solar cell.

41. The method of claim 40 wherein the thermal decomposition of the polymeric material results in gaseous decomposition product, said method further comprising combusting the gaseous decomposition products in a pyrolytic afterburner to yield carbon dioxide and water vapor.

* * * * *

UNITED STATES PATENT AND TRADEMARK OFFICE
CERTIFICATE OF CORRECTION

PATENT NO. : 6,063,995
DATED : May 16, 2000
INVENTOR(S) : John Raphael Bohland et al.

It is certified that error appears in the above-identified patent and that said Letters Patent is hereby corrected as shown below:

Column 1,
Line 1, after the title and before Technical Field insert:
-- Statement of Government Rights
This invention was made with government support under contract number DE-GF02-95ER82068 awarded by the United States Department of Energy. The government has certain rights in this invention --

Column 7,
Line 55, Claim 32: delete "21" and insert -- 31 --.

Column 8, Claim 39:
Line 40, delete second occurrence of "to a temperature".

Signed and Sealed this

Twenty-eighth Day of August, 2001

Attest:

*Nicholas P. Godici*

NICHOLAS P. GODICI
*Attesting Officer*    *Acting Director of the United States Patent and Trademark Office*